United States Patent [19]
Horn, deceased

[11] 3,917,495
[45] Nov. 4, 1975

[54] METHOD OF MAKING IMPROVED PLANAR DEVICES INCLUDING OXIDE-NITRIDE COMPOSITE LAYER

[75] Inventor: F. Hubbard Horn, deceased, late of Schenectady, N.Y., by Helen W. Horn, executrix, Schenectady, N.Y.

[73] Assignee: General Electric Company, Schenectady, N.Y.

[22] Filed: Aug. 16, 1974

[21] Appl. No.: 497,856

Related U.S. Application Data

[63] Continuation of Ser. No. 42,269, June 1, 1970, abandoned, and a continuation-in-part of Ser. No. 530,811, March 1, 1966, Pat. No. 3,597,267.

[52] U.S. Cl. ................ 148/187; 117/215; 117/217; 148/1.5; 148/33.3; 357/52

[51] Int. Cl. ............................................ H01l 11/00

[58] Field of Search .................... 148/1.5, 33.3, 187; 117/215, 217; 357/52

[56] References Cited

UNITED STATES PATENTS 3,419,761 12/1968 Pennebaker ........................ 317/234
3,477,886 11/1969 Ehlenberger ........................ 148/187

OTHER PUBLICATIONS

Maguire, "Silicon's New Wonder Drug," Electronics, Vol. 39, No. 1, Jan. 10, 1966, pp. 156–164.

*Primary Examiner*—L. Dewayne Rutledge
*Assistant Examiner*—J. M. Davis
*Attorney, Agent, or Firm*—Jerome C. Squillaro; Joseph T. Cohen

[57] ABSTRACT

Improved method for fabricating semiconductor devices including insulating layer over semiconductor body and metallic member over insulating layer prevents degradation of insulator by impurity ion, principally alkali ion, penetration. In accord with the process, a silicon dioxide passivation layer is first formed over the surface of the semiconductor and a thin layer of amorphous silicon nitride, impervious to alkali ion penetration is deposited over the silicon dioxide. Combined steps provide insulator which has excellent insulating properties of silicon dioxide and impermeability to alkali ions of amorphous silicon nitride.

21 Claims, 4 Drawing Figures

METHOD OF MAKING IMPROVED PLANAR DEVICES INCLUDING OXIDE-NITRIDE COMPOSITE LAYER

This application is a continuation of Ser. No. 42,269 filed June 1, 1970, now abandoned, and a continuation-in-part of Ser. No. 530,811 filed Mar. 1, 1966, now U.S. Pat. No. 3,597,267.

This invention relates to planar semiconductive device fabrication processes which include the formation of insulating oxide layer disposed over the surface of the device.

Planar passivated devices and integrated circuits are of particular importance in the general field of semiconductors, principally because of their extremely small size and substantially lower cost. Simultaneous operations on a single wafer produce one thousand or more devices, thus distributing the expense of the process and minimizing the cost per device. It is accordingly, of interest to increase the quality of planar devices so that these advantages can be realized in circuits for which the performance requirements are high.

Planar devices generally comprise a body of semiconductive material, such as silicon or germanium, having a substantially planar active major surface, and an insulating layer comprising a metallic oxide over the planar active surface. The devices may include a metal contact over the insulating layer as in the case of variactors or capacitors, or a junction between major surface-adjacent regions of varying conductivity in the semiconductive material as in the case of diodes or conventional transistors, or various combinations of these as in the field effect transistors. Conventionally, the insulating layer used is an oxide of silicon because, on silicon wafers, it can readily be produced by baking the silicon in an oxygen, containing atmosphere as is described in greater detail in Sandor Pat. No. 3,158,505, to form, thermally, a very pure oxide of silicon in which the silicon is the highly purified silicon from the active major surface of the original wafers. Silicon dioxide is an effective diffusion mask for certain conductivity determining impurities and serves to provide a degree of electrical and chemical isolation of the surface. Also, because it is produced by reacting oxygen with unexposed silicon, the oxide-silicon interface is completely clean, thus avoiding the problems inherent in depositing a material on the semiconductor.

However, planar devices including such oxide layers have been subject to several problems which limit the performance characteristics obtainable, necessitate the use of great care in handling of the devices and contribute substantially to the cost of such devices. A particularly severe example of this is the instability of planar devices under high temperature which arises, despite the supposed insulating effect of the oxide layer, from contamination by various impurities, principally alkali metals such as sodium which are usually present in metallic contacts and conductors deposited upon the oxide layers in forming devices and circuits. Also, it has been found that application of a positive voltage to an aluminum contact overlying such oxide-semiconductors causes deterioration of the oxide, perhaps due to the reduction of $SiO_2$ to SiO by the aluminum electrodes, but more probably due to migration of sodium ions from the aluminum to the semiconductor surface under the applied field stress and occurrance of a short circuit across the surface of the semiconductor due to the occurrance of spurious channels.

It is accordingly an object of this invention to provide new and improved methods of forming planar semiconductive devices.

It is a further object of this invention to provide new and improved planar devices of the oxide-semiconductor type.

Another object is the provision of new and improved planar passivated semiconductive junction devices.

A further object is the provision of new and improved methods of fabricating planar semiconductive devices of the metal-oxide-semiconductor type.

It is also an object of this invention to provide new and improved fabrication process for planar devices of the oxide-semiconductor types including a method of forming an improved high stability, impermeable passivation structure.

Another object of this invention is the provision of new and improved planar devices of the oxide-semiconductor type in which the above-mentioned surface effects are eliminated.

Briefly, in accord with one embodiment of this invention, I provide an improved method for forming improved planar oxide coated semiconductive devices having increased stability and impermeability which include a body of semiconductive material of predetermined conductivity having a substantially planar surface and an oxide layer contiguous with the surface. The device may include additional regions of different conductivity and junctions between such regions, the regions and junctions emerging in the planar surface. In accord with the improvement of this invention, a barrier layer of amorphous silicon nitride is deposited contiguous with at least selected portions of the oxide layer to stabilize and seal the device.

In one type of device so constructed, the insulating layers serve to passivate the underlaying structure such as the regions of differeing conductivity and junctions therebetween. In this case, the oxide thickness may range between 0.1 and 1 micron and the nitride may range from 50 Angstrom units to 500 Angstrom units or more if desired. In another type of device, a metallic electrode is formed over the nitride and an electric field is applied between it and the underlying semiconductor. In this case, the oxide thickness may range from 100 to 3000 Angstrom units and the nitride thickness may range from 50 to 500 Angstrom units.

The novel features believed characteristics of the invention are set forth in the appended claims. The invention itself, together with further objects and advantages thereof, may best be understood by reference to the following description taken in connection with the appended drawings in which:

Figure 1:
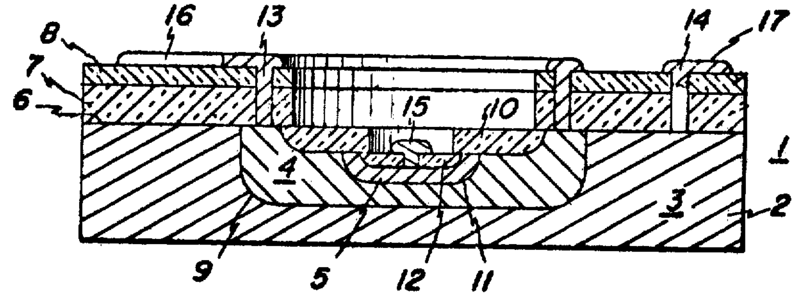
FIG. 1 is a schematic view in vertical cross section of a device constructed in accord with the method of the present invention.

In FIG. 1 a transistor 1 fabricated in accord with the present invention is illustrated. The device comprises a body 2 of silicon containing three regions of different conductivity. As used throughout the specification and claims, the reference to regions of different conductivity is intended to apply to differences in numerical level and/or type of conductivity. The transistor of FIG. 1 may, for example, comprise a phosphorous-doped n-type collector 3, a boron-doped p-type base 4 and a phosphorous-doped n-type emitter 5.

In the conventional planar process, as described for example, in Hoerni Pat. No. 3,064,167 and Hugle Pat. No. 3,165,430, such a device is produced for example, by providing the phosphorous-doped body 2 with an oxide coating on a planar active major surface 6, diffusing boron through an opening made in the oxide, reoxiding the opening and diffusing phosphorous through a smaller opening within the area of original opening. A final oxide layer is then deposited over the modified wafer as shown by Noyce Pat. No. 2,981,877, contacts to the different, isolated regions are formed by forming a layer of a metal, usually aluminum, over the last deposited oxide film and contacting the different regions through discrete apertures in the oxide film. The contact leads cross different conductivity regions and p-n junctions, in many instances. As is set forth in greater detail in the aforementioned patents and in the art, for germanium and silicon appropriate donors include arsenic, phosphorus and antimony, while appropriate acceptors include, for example, aluminum, gallium, and boron. Similarly, appropriate diffusion temperatures may range from 900°–1300°C, for example, for silicon and approximately 600°–900°C for germanium.

In accord with the present invention, a modified planar process includes depositing a coating of amorphous silicon nitride, $Si_3N_4$, thereover after one or more of the oxide coatings has been produced, the number of nitride coatings depending on the requirements of the particular device. For example, in a transistor, it may be sufficient to deposit a nitride coating only after the first ocide coating so as to cover the collector-base junction. Since this junction is between two lightly doped regions, it is subject to breakdown at low voltage due to the lower concentration of sodium ions required to induce spurious channels therein. The nitride coating of this invention increases the surface breakdown voltage by a factor of two or more. The single nitride is sufficient if the oxide produced in later steps is sufficiently stable for the intended use. In other devices, it may be desirable to deposit nitride coatings over some or all of the oxide coatings or only over the last oxide coating.

The amorphous silicon nitride coating formation steps of the present invention may be any of many processes for depositing silicon nitride. Heretofore, such processes have been utilized for the formation of silicon nitride coatings as the sole insulator on silicon semiconductor surfaces, but the use has met with only limited success, largely in that silicon nitride is not a good insulator by itself in that is exhibits some electronic conduction and may be polarized by electronic trapping. Additionally, as a passivating agent for the prevention of surface states, silicon nitride is inferior to pure, uncontaminated, thermally-grown silicon dioxide, which is a far better insulator, exhibiting practically no electronic conduction.

Some processes, for deposition of layers of amorphous silicon nitride well known to those skilled in the art, are pyrolysis of a silicon-containing hydrocarbon gas such as a silane, silicon tetrachloride, silicon tetraiodide, or silicon tetrabromide, for example, with a nitrogen containing gas such as ammonia, for example, as well as deposition of $Si_3N_4$ by evaporation or sputtering of silicon in a reactive, nitrogen-containing atmosphere. A summary of such methods appears in an article entitled "Properties of Amorphous Silicon Nitride Films" by S. M. Hu appearing in the *Journal of the Electrochemical Society*, Vol. 113, No. 7, and first presented at the Meeting of the Electrochemical Society at Buffalo, N.Y., on Oct. 10–14, 1965. See also "Chemical Vapour Deposition Promoted by r.f. Discharge" by Sterling and Swann, *Solid State Electronics*, Vol. 8, p. 653, and "Preparation and Properties of Pyrolytic Silicon Nitride" by Doo et al., *Journal of the Electrochemical Society*, Vol. 113, No. 13, p. 1279.

In the transistor of FIG. 1, for convenience of illustration, the silicon nitride has been shown as applied only after the first thermally grown oxide coating. Thus, the passivation structure comprises an oxide layer 7 covered by a silicon nitride layer 8. In the central region of the device, these layers have been removed by photolithographic techniques for the diffusion of the impurity which produces region 4 and junction 9. Either during or after introduction of the impurity activator, another oxide coating 10 is produced in the silicon. In accord with the well-known planar techniques, an oxide may be grown during diffusion of the impurity by first forming a heavily doped thin oxide, or an alloy of the activator on the silicon on the silicon surface. The wafer is then heated in an oxidizing atmosphere to conventional diffusion temperatures to cause the diffusion of the surface deposited activator and the simultaneous growth of a surface oxide, as is taught by Hoerni Pat. No. 3,064,167. Alternatively, as taught by Hugle Pat. No. 3,165,430, a suitable surface-adjacent region may be conductivity, modified by heating the wafer in an activator-containing atmosphere at conventional diffusion temperatures and, thereafter, a second oxide is grown upon the exposed conductivity-modified silicon, as, for example, by the exposure to steam in the presence of oxygen at elevated temperatures. An opening is then produced photolithographically in the oxide 10 and region 5 is produced by diffusion of an impurity activator to junction 11. This may be accompanied with, or followed by, production of another oxide layer 12 over region 5. Finally, holes are produced in the layers and electrodes 13 are provided by evaporation of a metal, usually aluminum, into the holes and onto relatively large surface areas to provide landing pads broad enough for the attachment of wire electrodes.

As previously noted, the surface breakdown voltages of collector-base junctions formed with the overlying silicon nitride coating has been found to be increased by a factor of two or more over similar junctions covered with an oxide coating but without the silicon nitride. Other advantages obtained from the improved passivation structure include stability and avoidance of the effect of electrodes on the oxide, believed due to permeation of the oxide by sodium ions which migrate to the silicon surface and reduce breakdown strength.

More specifically, the silicon nitride apparently prevents the introduction of impurities such as alkali metal ions which are believed to have been responsible for the substantial instabilities found in devices coated only with an oxide. For example, the alkali ions, primarily sodium, may be introduced into the oxide during the evaporation of electrodes; these ions are then believed to drift through the oxide and reduce its insulating characteristics, to a degree depending upon the alkali ion concentration. In accord with this invention, the instabilities which arise in the operation of conventional oxide coated devices are substantially reduced in devices which have been covered with an impervious coat of silicon nitride. Thereafter, the electrodes and leads may be evaporated, etched and heated to a temperature of approximately 600°C for approximately one minute as is described in Hung Chan Lin Pat. No. 3,200,001. Actually, since the alloying is to the silicon, it is only necessary to heat to approximately 570°C, the silicon-aluminum eutectic temperature. Often, heating to about 500°C is sufficient, particularly if gold electrods are used.

It has also been found that the oxide underlying the aluminum electrodes of prior art devices, for example, the landing pads 16 and 17 shown as part of electrodes 13 and 14 in FIG. 1, tend to produce a conductive path through the oxide if left under a positive bias for a sufficient length of time. In devices coated with a deposited layer silicon nitride, in accord with the invention, this effect has been found to be eliminated. Also, as previously noted, the surface breakdown voltage of nitride-coated device is increased substantially, apparently due to the alkali ion imperviousness of amorphous silicon nitride as compared to the conventional oxide. An additional advantage of this invention is that, due to the impermeability of the nitride coating, the expense of encapsulating the device, which constitutes a substantial portion of the total cost, may be avoided in some situations. In conventional devices, encapsulation is required since otherwise the oxide may be destroyed by ambient impurities such as water vapor. The nitride coatings of the present invention had been found to be impervious to such impurities and therefore, the devices need not be encapsulted. In addition to the large cost, advantage, this also reduces size and weight of the device.

In general, it is noted that formation of the device shown in FIG. 1 is only expletive of the application of the present invention. For example, it is noted that the terms "planar" and "substantially planar" as used in the description and claims are applied, in accord with the terminology used in the art, to devices and circuits pprepared by diffusion of impurities into, or epitaxial deposit of, thin layers on to a semiconductive wafer having a substantially planar surface. The minor variations introduced by epitaxy or by conversion to an oxide and removal thereof in selected regions actually produce a variation of only a few microns in a device having a width of 1 or 2 millimeters and a depth in the order of one-half millimeter and are, thus, not significant. Furthermore, it is apparent that this invention includes the fabrication of those devices or circuits which include diffusion into two substantially parallel surfaces of a single wafer, as for example, in field-effect transistors.

Furthermore, it is noted that although this description is given in terms of silicon for convenience and because of the unique advantages of this improvement as applied to silicon, it is fully intended that fabrication of planar devices of other semiconductive materials is included. In general, therefore, this invention includes the deposition of a silicon nitride coating over at least a selected region of an oxide passivating-insulating layer which covers a planar semiconductive circuit or device as a portion of the fabrication process thereof, whether the material to germanium, silicon or gallium arsenide, for example. In the case of silicon, the oxide is generally produced by direct thermal growth onto the wafer; in other materials, an oxide such as silicon dioxide may be deposited by sputtering or other oxides may be used.

It is noted that the present invention is particularly applicable to silicon, since only in silicon is the oxide produced by direct growth into a virgin crystal lattice, thus enabling one to continue the advantages of a clean oxide-silicon interface and, at the same time, to achieve those described herein from the deposition of a nitride layer over an oxide layer.

In the particular case of junction devices, in which the junctions and the regions of varying conductivity emerge at the planar surface of the semiconductor, the oxide layer used is relatively thick and serves as a junction passivating layer. This effect includes electrical insulation from overlying electrodes, reduction of fringing field strength, chemical isolation of the semiconductor from atmospheric impurities and avoidance of surface breakdown due to the formation of channels around the junction in the covering material, all due to the unexcelled insulating characteristics of silicon dioxide. In the case of such devices, it is generally preferred that the oxide layer be in the range of from 0.1 to 1 micron although it may lie beyond this range in some cases. It has been found that the deposited silicon nitride coating of the present invention need only be on the order of a few hundred Angstrom units thick to isolate the oxide layer from contaminants, principally sodium and enable the silicon dioxide layer to accomplish the above-described advantages and is preferably approximately 200 to 500 A.U. thick. In general, however, the nitride coating may range in thickness from 50 to 500 Angstrom units although thicker coatings of, for example, 5,000 A.U. may be applied.

Figure 2:
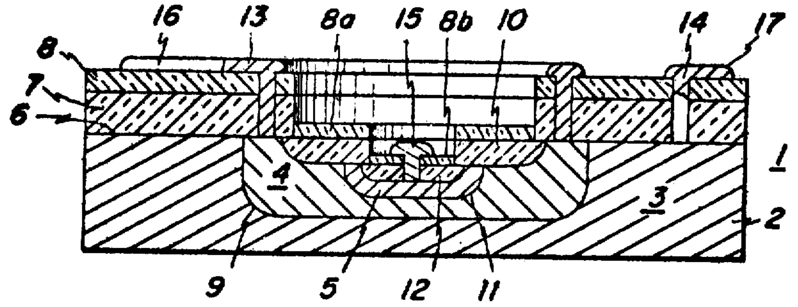
FIG. 2 is a schematic view in vertical cross section of another device constructed according to the present invention.

FIG. 2 illustrates a transistor in which the improvements and advantages gained by the practice of the present invention are utilized over the entire active major surface of the device by depositing a protective nitride layer on each of the respective oxide coatings during preparation of the device. The device is similar to that of FIG. 1 with corresponding elements designated by corresponding numbers. The additional nitride coatings, identified as elements 8*a* and 8*b*, are respectively deposited on the oxide layers 10 and 12. This is accomplished by depositing silicon nitride on the surface of the wafer after each oxide is produced and prior to etching the opening in the respective oxides for the next process step.

The devices prepared in accord with the present invention include the many advantages of previously known oxide-coated planar devices while avoiding the disadvantages thereof. For example, oxide-coated devices are preferred because the oxide-semiconductor interface maintains a given surface potential in the semiconductor while other insulators allow carrier leakage and drift of the surface potential. In some cases, the oxide forms a better mask during introduction of impurities than other coatings do. Also, in the case of silicon, the oxide is usually produced by direct thermal growth into the silicon, thus providing a clean oxide-silicon interface. This fact also permits control to be established over the impurity concentration since, if an incorrect amount of the impurity is predeposited, the growth rate of an oxide during diffusion may be used to compensate. Finally, in present photolithograhic processes, an oxide coating is preferred because a thick oxide, required for junction passivation, etches more readily than the photoresist layer. Other thick coatings are difficult to etch and the photoresist mask may be inadvertently removed.

The method of making devices in accord with this invention corresponds substantially with that of the prior art with the exception of the critical step of depositing an impervious, amorphous nitride coating over the passivating oxide. The process generally includes thermally oxiding a semiconductive wafer, masking and etching photolithographically the oxide coating or layer to produce openings therein and introduction of the desired impurity therethrough by diffusion. This may be done by direct diffusion or by predeposition and diffusion. To accomplish the nitriding step after any oxide coating step, a suitable system for depositing silicon nitride may be used, for example, a furnace containing an atmosphere of $SiH_4$ and ammonia is satisfactory. It has been found that coatings of silicon nitride approximately 300 Angstrom units thick may be produced by maintaining the wafer at a temperature of 1000°C for about 1 minute in such an atmosphere. Such films have been found to be dense, amorphous and uniform in thickness.

The photolithographic steps preparatory to etching the required openings for diffusion of impurity are exactly the same as those of the prior art, for example, as described in the publication "Photosensitive Resist for Industry", published by the Eastman Kodak Company, 1962. it has been found that the chemicals used to etch the oxide are also suitable for etching silicon nitride, although the times involved are somewhat longer. For example, an appropriate aperture can be etched in a layer of oxide 10,000 Angstrom units thick by an HF solution in about one minute while the etching of 300 Angstrom units of silicon nitride in the same solution requires approximately two minutes.

Finally, after the insulating films have been deposited and desired diffusion steps have been performed to produce diodes, bipolar transistors, field-effect transistors or any other desired device, electrical contacts are made to the desired regions of the devices, as for example, to the source, drain and gate of a field-effect transistor by conventional process steps. Typically as is set forth in the aforementioned Noyce and Hung Chang Lin patents, aluminum may be evaporated over the entire device, the desired pattern retained by photolithographic masking and etching, and the aluminum alloyed and fixed in place by an appropriate heating step, as for example, at approximately 600°C for 1 minute. Preferably the heating is carried out at the silicon-aluminum eutectic temperature of about 570°C.

Figure 3:
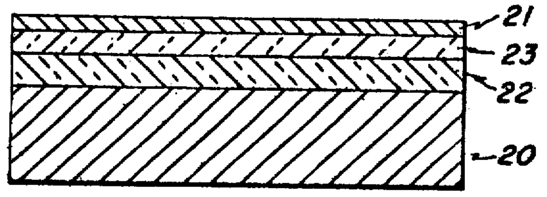
FIG. 3 is a schematic view in vertical cross section of another type device fabricated according to this invention.

FIG. 3 illustrates an additional device fabricated in accord with the invention, a capacitor, which may, for example, be used in many applications as a variactor, comprising a semiconductor body 20 and a metal layer 21 separated by insulating material. In accord with this invention, the conventional oxide layer 22 is covered by a deposited impervious layer 23 of silicon nitride. In the case of capacitors and other devices in which a field is applied across the insulating layer, the thickness of the oxide is substantially less than that used for passification of junction devices, being on the order of a few hundred to 1000 Angstrom units rather than several thousand, as in passivation.

In devices constructed in accord with prior art techniques, the difficulties of contamination of the oxide by ions, primarily alkalis such as sodium, and the subsequent drift thereof has interfered severely with stable operation of such devices, particularly since the oxides are thin and since the operation of the devices is based on the effect of a field across the oxide. Therefore, these ions cause especially severe difficulties. This is further magnified by the fact that the metallic contact which often serves as the source of alkali ions is often of relatively broad area as compared with the thickness of the oxide layer and the number of ions which may enter the oxide is great. Also, the deterioration of silicon dioxide by chemical reaction with metals, for example, at elevated temperatures with aluminum, and the resultant possibility of short circuit through the oxide, is increased by the broad area contact and by the shallow depth of the oxide.

Deposition of the additional inert ion-impervious coating of amorphous silicon nitride in accord with this invention has been found to overcome the foregoing difficulties and results in devices which are substantially more stable and less subject to deterioration than analogous prior art devices. Alkali ions present during the evaporation of the metallic contact upon the insulator cannot pass through the deposited nitride layer and are thus prevented from changing the operating characteristics of the device. The aluminum of the contact cannot chemically react with the passivation oxide since it is separated therefrom by the deposited nitride and, therefore, no short circuit through the oxide develops.

A comparison of devices prepared from similar wafers, coated with identical oxides has shown that the drift of the devices additionally coated with silicon nitride is reduced to less than 1 volt when held at temperatures up to 300°C for 10 hours or more as compared to a drift of 25 volts for the devices without the nitride, after 1 hour at 280°C. The number of short circuits through the insulating layer when the metal contact is positively biased has been found to be greatly reduced when coated with silicon nitride. Finally, as previously noted, the deposition of the nitride permits, in many instances, the device to be used without the expense, size and weight of encapsulation, since ambient impurities which destroy the conventional oxide do not penetrate the nitride. Again, it is noted that the present invention results in an improvement over the presently known oxide devices which permits the advantages previously noted, such as the clean interface, the improved masking of some impurites, and the diffusion control ability to be retained while overcoming the noted disadvantages.

Figure 4:
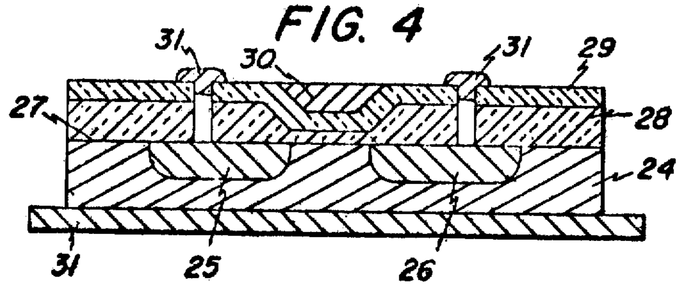
FIG. 4 is a schematic view in vertical cross section of a device formed in accord with a preferred method of practicing the present invention.

FIG. 4 illustrates a field-effect transistor prepared in accordance with the present invention. The device comprises a body of silicon 24 of predetermined conductivity having therein two separate regions 25 and 26 of opposite conductivity type. Overlying the active major planar surface 27 of body 24, there is provided the conventional thermally grown oxide layer 28 and, in accord with the present invention, a layer 29 of silicon nitride deposited as is described hereinbefore. An aluminum gate electrode 30 is also provided and contacts 31 are made to the source and drain regions of the device. The oxide layer 28 is relatively thick for passivation except in the central region of the device between the two opposite conductivity regions 25 and 26. In accord with conventional operation of such devices, a field is applied across the oxide in this central region to control the width, and therefore, the amount of conduction, through a channel between the two regions. The oxide layer conventionally used under the drain in such devices is on the order of several hundred to more than 1000 Angstrom units in thickness, while the field oxide may be approximately 10,000 A.U., as mentioned hereinbefore.

In accord with this invention, a layer on the order of a few hundred Angstrom units of nitride is deposited upon and overlies the oxide which, in the region of thick oxide, functions as previously described in connection with the transistors of FIGS. 1 and 2 to enhance the junction passivating effect of the oxide. In the central region above conduction channel, the nitride functions similar to that described with relation to the capacitor shown in FIG. 3; that is, it insulates the oxide from the aluminum electrode 30, prevents introduction of ions which might interfere with the applied field and it increases the surface breakdown voltage of the insulating structure.

In tests conducted on devices constructed in accord with this invention, it has been found that the nitride placed over the oxide in the region above the channel is preferably less than the thickness of the oxide. Again, the method of the present invention results in the provision of a device which embodies the advantages of the conventional oxide while overcoming the previously encountered disadvantages thereof.

It is noted that, in the formation of devices such as the enhancement mode field-effect transistor which combine the structure of the junction devices with that of the capacitor devices, the practice of present invention is, for numerous reasons, particularly advantageous. One such reason is that in field-effect transistors, under the gate electrode where the conventional oxide overlying the junction must be relatively thin to allow the field applied to the gate to have the desired effect. The thinness of the gate oxide also tends to permit the greater possibility of alkali ion accumulation at the silicon surface, which both lowers the reverse breakdown voltage and raises the forward threshold voltage of the F.E.T., both of which are undesirable. The higher resistance to alkali ion permeability of the thin deposited nitride layer in accord with practice of the present invention increases the surface breakdown voltage without substantially increasing the thickness of the layer.

While I have described several means of practicing my invention particularly with respect to the fabrication of different types of semicondctor devices, it will be apparent to those skilled in the art that many changes and modifications may be made without departing from my invention in its broader aspects; and I, therefore, intend the appended claims to cover all such changes and modifications as fall within the true spirit and scope of my invention.

What I claim as new and desire to secure by Letters Patent of the United States is:

1. In the process of fabricating a semiconductor device including a monocrystalline wafer of a semiconductor material of a given conductivity type having an active major surface of relatively high resistivity with at least one discrete major surface-adjacent portion thereof of a different conductivity type, with a layer of passivating-insulating material covering said active major surface and the intersection of said different conductivity regions, and having a metallic contact member in electrical contact with said discrete surface-adjacent region and overlying at least a portion of said insulating layer, the improvement including the steps of a. forming over the active major surface of said semiconductor wafer an insulating-passivating layer of silicon dioxide; and b. depositing over said silicon dioxide an amorphous layer of silicon nitride which is impervious to impurity ions of the alkali metal class at elevated temperatures to protect said silicon dioxide from alkali ion contamination from deposited metallic contacts.

2. The process of claim 1 wherein said silicon nitride layer is impervious to alkali metals at temperatures of the order of 500°C–600°C.

3. The process of claim 1 wherein said semiconductor material is silicon.

4. The process of claim 1 wherein said silicon dioxide insulating layer is formed to a thickness of approximately 1000 A.U. to 10,000 A.U. thick and said silicon nitride film is deposited to a thickness of approximately 50 to 500 A.U. thick.

5. The process of claim 4 wherein said silicon nitride film is deposited to a thickness of approximately 200 to 500 A.U. thick.

6. The process of claim 1 wherein said silicon nitride layer is deposited by a vapor phase reaction at the vicinity of the silicon dioxide layer, said reaction occurring between separate sources of silicon and nitrogen.

7. The process of claim 6 wherein said silicon nitride layer is deposited by the pyrolysis of a silicon containing compound in the presence of ammonia at a temperature of approximately 800° to 1100°C.

8. The process of claim 7 wherein said silicon containing compound is silane.

9. The process of claim 6 and including the further steps of a. sequentially etching at least one aperture in said silicon nitride and said silicon dioxide films to expose the active surface of said semiconductor body;

b. diffusing a conductivity modifying activator impurity through said aperture to form said different conductivity surface-adjacent region;

c. forming a metallic contact member in electrical contact with said different conductivity active surface-adjacent region and overlying at least a portion of said silicon nitride layer.

10. The process of claim 6 wherein said metallic contact member is made of aluminum.

11. The process of claim 6 wherein a plurality of etching and diffusion steps are performed sequentially and wherein a layer of silicon dioxide is formed upon the exposed semiconductor surface after each diffusion step and an alkali ion-impervious layer of silicon nitride is deposited over said silicon dioxide film.

12. The process of claim 11 wherein a first active surface-adjacent region is impurity-diffused to a first predetermined depth to create a first active surface-adjacent region of a conductivity type different from that of said wafer, a second active surface-adjacent region within and of lesser surface dimension is impurity-diffused to a second predetermined depth to create an active surface-adjacent region of a conductivity type different from said first impurity diffused region, and separate contact members are made to each of said regions and to said active major surface of said wafer.

13. The process of claim 6 wherein a plurality of separate apertures are simultaneously etched through each of said silicon nitride and said silicon dioxide layers and a conductivity modifying impurity is simultaneously diffused through said apertures to create a plurality of active surface-adjacent regions of different conductivity characteristics than said wafer.

14. The process of claim 13 wherein two such apertures are very closely spaced, and said active surface-adjacent regions are diffused with conductivity modifying impurities to render the conductivity type thereof opposite to that of said wafer and to form source and drain regions of a field-effect transistor.

15. The process of claim 6 wherein said semiconductor body is silicon.

16. The process of claim 6 wherein said silicon dioxide insulating layer is formed to a thickness of approximately 1000 A.U. to 10,000 A.U. and said silicon nitride film is deposited to a thickness of approximately 50 to 500 A.U. thick.

17. The process of claim 16 wherein said silicon nitride film is deposited to a thickness of approximately 200 to 500 A.U. thick.

18. The process of claim 1 including the further steps of a. sequentially etching a plurality of separate apertures through each of said silicon nitride and said silicon dioxide layers to expose the active surface of said semiconductor body;

b. diffusing a conductivity modifying activator impurity through said apertures to form said different conductivity surface-adjacent regions; and c. forming a metallic electrode over said silicon nitride layer in at least a region between two adjacent apertures.

19. The process of claim 18 including the further step of a. forming separate contact members to each of said different conductivity surface-adjacent regions and to said metallic electrode.

20. The process of claim 19 wherein said metallic contact member is made of aluminum.

21. The process of claim 18 wherein said silicon dioxide is formed to a thickness of several hundred to more than 1000 A.U. and said silicon nitride is deposited to a thickness of approximately 200 to 500 A.U.

* * * * *

Disclaimer 3,917,495.—*F. Hubbard Horn*, deceased, late of Schenectady, by Helen W. Horn, executrix, Schenectady, N.Y. METHOD OF MAKING IMPROVED PLANAR DEVICES INCLUDING OXIDE-NITRIDE COMPOSITE LAYER. Patent dated Nov. 4, 1975. Disclaimer filed Jan. 12, 1976, by the assignee, *General Electric Company*.

The term of this patent subsequent to Aug. 3, 1988, has been disclaimed.

[*Official Gazette March 16, 1976.*]